United States Patent
Nogawa

[11] Patent Number: 6,147,530
[45] Date of Patent: Nov. 14, 2000

[54] PLL CIRCUIT

[75] Inventor: Hiromichi Nogawa, Yamagata, Japan

[73] Assignee: NEC Corporation, Tokyo, Japan

[21] Appl. No.: 09/172,770

[22] Filed: Oct. 15, 1998

[30] Foreign Application Priority Data

Oct. 15, 1997 [JP] Japan ..................................... 9-282176

[51] Int. Cl.$^7$ ..................................................... H03L 7/06
[52] U.S. Cl. .............................. 327/156; 327/107; 331/11
[58] Field of Search ........................ 331/11, 17; 327/107, 327/147, 148, 156, 157, 158; 375/375, 376

[56] References Cited

U.S. PATENT DOCUMENTS 5,574,406  11/1996  Sauer et al. ............................... 331/11

FOREIGN PATENT DOCUMENTS 4-215338   8/1992   Japan .

*Primary Examiner*—Tuan T. Lam
*Assistant Examiner*—Linh Nguyen
*Attorney, Agent, or Firm*—Foley & Lardner

[57] ABSTRACT

In a PLL circuit, a phase comparator compares phases between a data signal train and a regenerated clock generated within the PLL circuit based on a clock with which the data signal train is synchronizing, and outputs a phase error signal. A frequency comparator compares frequencies between the data stream signal and the regenerated clock and outputs a frequency error signal. When the frequency difference between the both is large, only the frequency system loop operates to carry out a frequency pull in operation of the regenerated clock. When the frequency difference becomes smaller than a predetermined value, an operation by the phase system loop is added to carry out a phase pull in operation. When the phase difference becomes a predetermined value, the phase is locked. When the frequency difference exceeds the predetermined value again during the phase locked period, the operation of the phase system loop is suspended and only the frequency system loop carries out the frequency pull in operation.

14 Claims, 9 Drawing Sheets

- - - - - - : LPF4 SIDE VOLTAGE TRANSITION

↕ : LPF3 SIDE VOLTAGE TRANSITION

PLL CIRCUIT

BACKGROUND OF THE INVENTION

1. Field of the Invention

The present invention relates to a PLL circuit, and more specifically to a PLL circuit for generating clocks used as a time reference in a digital recording and reproducing device.

2. Description of the Related Art

A PLL circuit of the above kind is used for generating clocks used as a time reference when a data signal train having been recorded digitally is read for reproduction thereof. Specifically, in the case where the change point of the data signal train fluctuates in time and is not constant, an edge of the signal is detected to generate a pulse signal corresponding to the edge. By using a spectral component of a repeat frequency of the pulse signals, a continuous pulse signal can be generated. Hereinafter, this pulse signal is called a regenerated clock.

In general a PLL circuit is based on phase control. When a frequency of the data signal train which is a reference input to a phase comparator is too different from that of a regenerated clock which is a variable input, and the difference between these two frequencies is not in a frequency pull in range (frequency capture range), the control of a voltage controlled oscillator by the phase comparator is not carried out toward a reduction in the frequency difference, that is, a phase difference. As a result, phase locking is not achieved and an unlocked state remains. This problem is caused by a narrow capture range of the PLL circuit, and can be resolved by extending the capture range. Therefore, various methods have been proposed for extending the capture range, and one of them is described in Japanese Patent Laid-Open Publication No. Hei 4-215338. The PLL circuit described therein uses frequency control in addition to phase control in order to extend the capture range.

The conventional PLL circuit described above receives the data signal train in synchronization with a clock. In order to regenerate the data signal train, a regenerated clock synchronizing with both the phase and frequency of the clock is generated.

FIG. 1 is a block diagram showing the conventional PLL circuit. Phase comparator 101 compares phases between input data signal train ID and regenerated clock CK. When the phase of regenerated clock CK is ahead of that of input data signal train ID, phase comparator 101 outputs discharge control signal PDC at "1" level and charge control signal PC at "1" level if behind. Frequency comparator 102 compares frequencies between input data signal train ID and regenerated clock CK. When the frequency of regenerated clock CK is higher, frequency comparator 102 outputs discharge control signal FDC at "1" level and charge control signal FC at "1" level if lower. Control signal generating unit 103 generates discharge control signal DG and charge control signal CG in response to the supply of discharge control signals PDC and FDC, and charge control signals PC and FC respectively. Charge pump circuit 108 deposits or removes a charge in response to charge control signal CG or discharge control signal DG and generates charge pump signal VP of direct current. Low pass filter (hereinafter called LPF) 104 smoothes charge pump signal VP and outputs voltage control signal VC. Voltage controlled oscillator (hereinafter called VCO) 5 outputs oscillation signal OF whose frequency is controlled by voltage control signal VC. Frequency divider circuit 6 divides oscillation signal OF by a predetermined divide ratio and outputs regenerated clock CK at a desired frequency.

Charge pump circuit 108 comprises a P channel transistor and an N channel transistor. The source of the P channel transistor is connected to a power supply, and the P channel transistor receives the supply of charge control signal CG at its gate, and outputs charge pump signal VP from its drain. The source of the N channel transistor is connected to ground, and the N channel transistor receives the supply of discharge control signal DG at its gate. The drain of the N channel transistor is connected to that of the P channel transistor.

An operation of this PLL circuit will be explained next. When the frequency difference between the maximum repeat frequency of input data signal train ID and the frequency of regenerated clock CK is out of the capture range of the PLL circuit, frequency comparator 102 carries out the comparison between the above two frequencies. According to the difference of the frequency of regenerated clock CK to that of data signal train ID, discharge control signal FDC or charge control signal FC at level "1" is output. Control signal generating unit 103 outputs charge control signal CG or discharge control signal DG in response to charge control signal FC or discharge control signal FDC at "1" level. Charge pump circuit 108 deposits a charge and raises direct current charge pump signal VP when control signal CG is at level "0". When charge control signal DG is at level "1", charge pump circuit 108 removes a charge and lowers direct current charge pump signal VP and supplies VP to LPF 104. LPF 104 smoothes charge pump signal VP, outputs voltage control signal VC corresponding to the voltage of charge pump signal VP, and supplies the signal VC to VCO 5. VCO 5 outputs oscillation signal OF at a frequency proportional to control voltage VC. Frequency divider circuit 6 divides the frequency of oscillation signal OF by a predetermined divide ratio to output regenerated clock CK, and supplies CK to both frequency comparator 102 and phase comparator 101.

This operation is repeated until the frequency difference described above falls within the capture range and both charge control signal FC and discharge control signal FDC thus become level "0". When the frequency difference falls within the predetermined range through the above process, control signal generating unit 103 selects control signal PC or PDC from phase comparator 101, and outputs charge control signal CG or discharge control signal DG corresponding to the selected signal.

As has been described above, the difference between the maximum repeat frequency of data signal train ID and the frequency of regenerated clock CK is out of the capture range of the PLL circuit, frequency comparator 102 detects it and carries out a frequency pull in operation. When the frequency difference falls within the capture range, phase comparator 101 detects it and carries out a phase pull in operation and phase synchronizing operation. In this manner, the actual capture range can be extended.

However, as a first problem of this kind of conventional PLL circuit, although it is effective for a data signal train with almost constant frequencies, it is not applicable to widely changing frequencies such as in a constant angular velocity (CAV) operation of a compact disc.

This is because that only either the control signals FC and FDC (hereinafter called frequency error signals) of a frequency comparison result or control signals PC and PDC (hereinafter called phase error signals) of a phase comparison result are selected to drive the one charge pump circuit 8. As a result, the data signal train whose frequency and phase changes at the same time due to the CAV operation or the like cannot be followed and the phase locked state cannot be maintained. In other words, it is necessary to carry out the operation starting anew from frequency control at every frequency change. During this operation, the phase is unlocked and a stable phase locked state is not obtained.

A second problem is that extension of the range of the phase locked state, that is, extension of the lock range depends on the ability of phase control to follow a phase change, although the capture range can be extended. Therefore, the performance of the PLL circuit depends on the phase control operation alone.

This is because that the frequency control operation is not carried out in a phase locked state. In other words, a slight fluctuation in the frequency other than the large fluctuation in the frequency which occurs in the first problem is reflected as a phase error and the phase is locked by the phase control operation.

If the large and small fluctuations in the frequency is followed only by the phase control operation to maintain the locked state, a phase control loop having extremely large capture range and lock range is necessary. This circuit does not have any difference from a PLL circuit which basically has the phase control operation alone. In reality, a phase control operation having such large capture range and lock range is very difficult to be realized.

The third problem is that once the phase locked state is established, frequency control does not operate, even when the phase control and the frequency control cooperate in the PLL circuit at the same time by having charge pump circuits driven independently by the phase error signal and the frequency error signal, respectively, without switching between these signals in order to solve the first and the second problems.

This is because that a frequency error component is detected and fed back as a phase difference by the phase control system as long as it can follow. Therefore, once the phase locking is achieved, the frequency comparator does not sense unless the phase is unlocked.

In order to solve this problem, a frequency control system having sensitivity equivalent to that of the phase control system is necessary, and detection accuracy, that is, the resolution of the frequency comparator should be improved to a level equivalent to that of the phase comparator. As a result, such a frequency comparator means a frequency phase detector. When an input signal does not have constant change points thereof, like the case of a data signal train, a phase comparison result and a frequency comparison result may contradict. Therefore, phase comparison and frequency comparison cannot be applied at the same time.

In summary, since the above PLL circuit drives only one charge pump circuit by selecting either the frequency error signal or the phase error signal, data signal trains whose frequency is changing widely due to a CAV operation of a compact disc or the like and whose phase and frequency change at the same time cannot be followed and the phase locked state is not maintained. As a result, such a PLL circuit has a drawback that it is not applicable to a signal with widely changing frequency.

Furthermore, since the frequency control does not operate in the phase locked state and extension of the lock range depends on the ability of the phase control to follow phase changes although the capture range can be extended, it is a drawback of the PLL circuit that its performance is determined solely by the phase control operation.

Moreover, the frequency control does not operate once the phase locked state is established, since a frequency error component is detected and fed back as a phase error component as long as the phase control system can follow, even in the case where a PLL circuit is constructed so that the phase control and the frequency control may operate at the same time.

SUMMARY OF THE INVENTION

An object of the present invention is to provide a PLL circuit which has a wide capture range and a wide lock range even when frequencies of an input data signal train change widely, and enables frequency error detection without having a frequency dead band after the phase locked state has been established.

In order to achieve the above object, a PLL circuit of the present invention comprises:

a phase comparator which detects a phase difference between a data signal train synchronizing with a clock and a regenerated clock corresponding to the clock and regenerated from the data signal train, and outputs a phase error signal corresponding to the phase difference;

a frequency comparator which detects a frequency difference between the data signal train and the regenerated clock, outputs a frequency error signal corresponding to the frequency difference, and suspends the operation of the phase comparator when the frequency difference exceeds a predetermined value; and a variable frequency signal generating means which generates and outputs the regenerated clock based on the phase error signal and the frequency error signal. As the variable frequency generating means, a phase control voltage and a frequency control voltage which respectively correspond to the phase error signal and the frequency error signal are generated and the regenerated clock at a predetermined frequency are supplied to a loop control of the PLL circuit by controlling a voltage controlled oscillator by using an oscillation control voltage which is a sum of the phase control voltage and the frequency control voltage.

In the present invention, its frequency control loop is always active during the operation thereof, and the frequency comparator suspends the operation of the phase comparator when the frequency difference between the data signal train and the regenerated clock exceeds the predetermined value. Therefore, the frequency pull in operation is carried out so that the frequency difference is canceled by the loop control of the frequency system itself. When the frequency difference is below the predetermined value and continues for a certain period, the frequency comparator activates the phase comparator and a phase pull in operation by the phase comparator is carried out as well as the existing frequency pull in operation. Therefore, at this stage, pull in operations of both the frequency and the phase are carried out at the same time, and a phase locking operation is carried out by the phase comparator when the phase difference between the data signal train and the regenerated clock becomes equal to or less than a predetermined value. Furthermore, when the frequency difference continues again for a certain duration at this stage, the frequency comparator suspends the operation of the phase comparator. Then the frequency loop alone operates again.

As has been described above, in the PLL circuit of the present invention, the phase system loop and the frequency system loop are always active and controlled independently from each other. Therefore, a frequency change of an input data signal train can be followed even after the establishment of the phase locked state, and a wide capture range can be obtained. This is an important feature of the PLL circuit of the present invention.

The above and other objects, features, and advantages of the present invention will become apparent from the following description when taken in conjunction with the accompanying drawings which illustrate preferred embodiments of the present invention by way of example.

DESCRIPTION OF THE PREFERRED EMBODIMENTS

Figure 1:
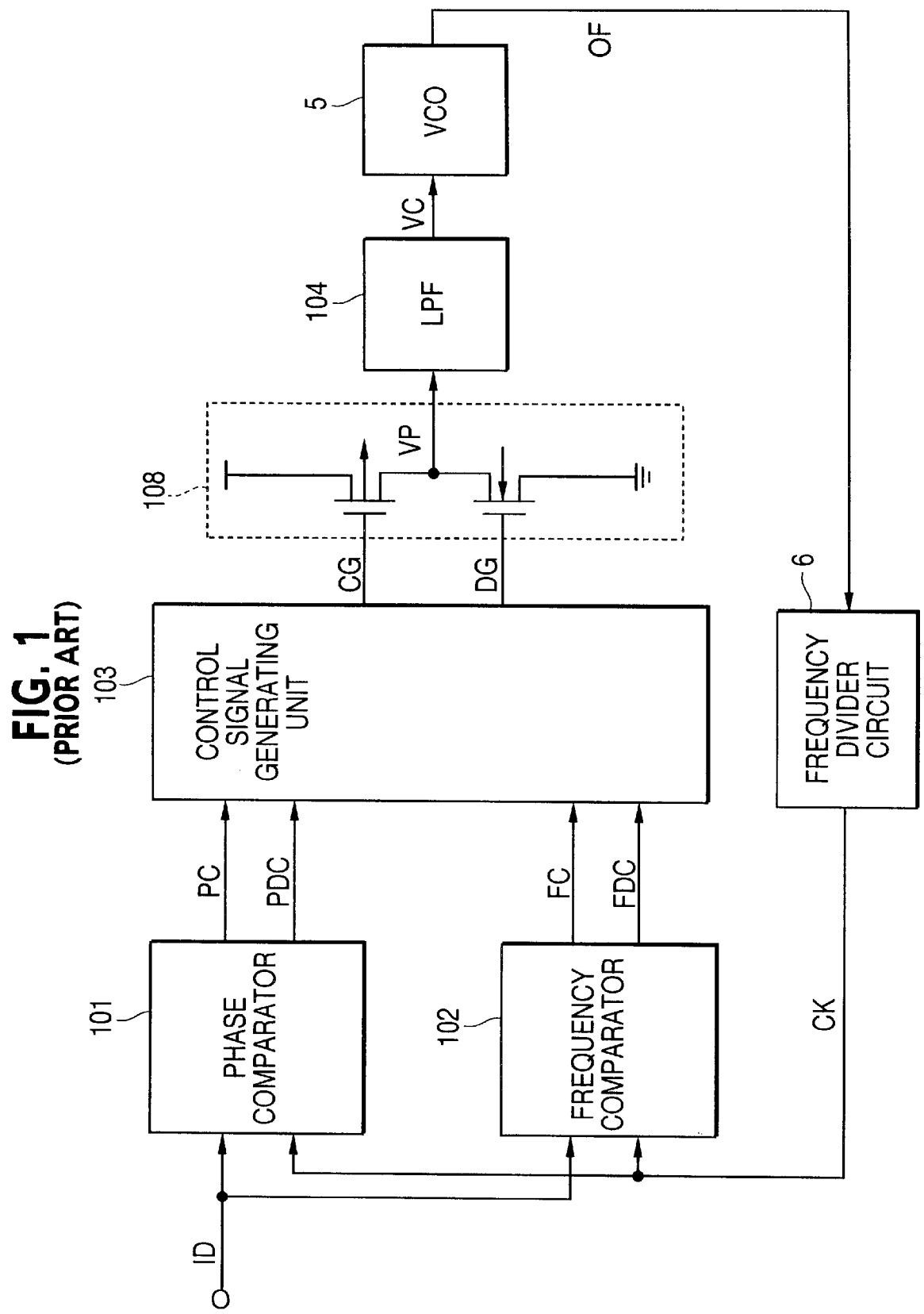
FIG. 1 is a block diagram showing an example of a conventional PLL circuit.
Figure 2:
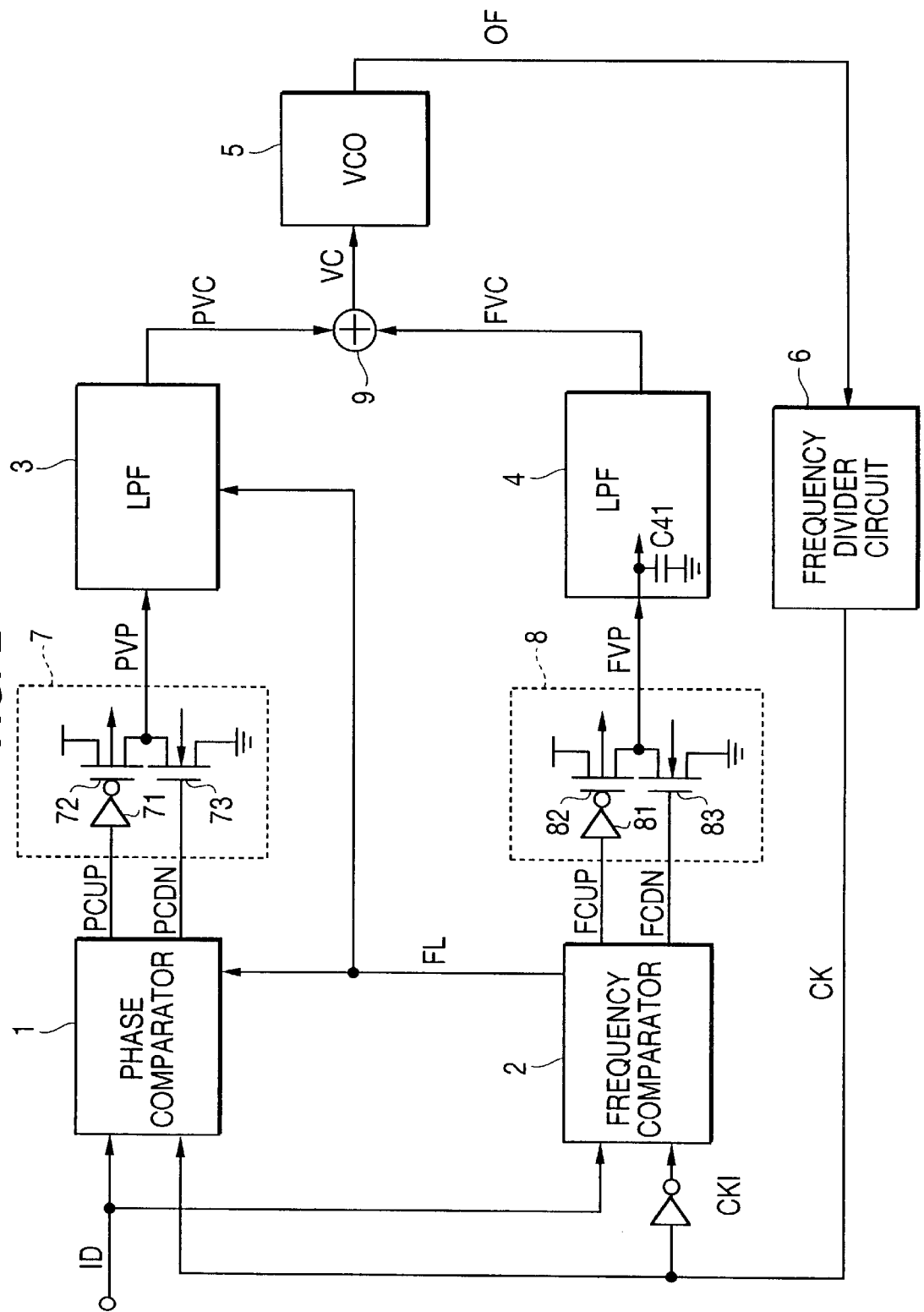
FIG. 2 is a block diagram showing a first embodiment of a PLL circuit of the present invention.

FIG. 2 is a block diagram showing a configuration of a first PLL circuit of the present invention. Like the PLL circuit shown in FIG. 1, the PLL circuit shown in FIG. 2 comprises VCO 5 which outputs oscillation signal OF whose frequency is controlled by voltage control signal VC, and frequency divider circuit 6 which divides oscillation signal OF by a predetermined divide ratio and outputs regenerated clock CK at a desired frequency. Phase comparator 1 compares phases of input data signal train ID and regenerated clock CK in response to the supply of frequency lock signal FL thereto, and outputs phase error signal PCUP or PCDN at "1" level when the phase of regenerated clock is behind or ahead of the phase of input data signal train ID respectively. Frequency comparator 2 compares frequencies between input data signal train ID and inverse regenerated clock CKI which is the inverse of regenerated clock signal CK, and outputs frequency error signal FCUP or FCDN at "1" level when the frequency of inverse regenerated clock CKI is lower or higher than the frequency of input data signal train ID respectively. Frequency comparator 2 also outputs frequency lock signal FL in response to the frequency locked state. Charge pump circuit 7 deposits or removes a charge in response to the supply of phase error signal PCUP or PCDN thereto and generates direct current charge pump signal PVP. Charge pump circuit 8 deposits or removes a charge in response to the supply of frequency error signal FCUP or FCDN thereto and generates direct current charge pump signal FVP. Low pass filter (LPF) 3 operates in response to the supply of frequency lock signal FL thereto and smoothes charge pump signal PVP and outputs voltage control signal PVC. LPF 4 smoothes charge pump signal FVP and outputs voltage control signal FVC. Adder 9 adds voltage control signals PVC and FVC and generates voltage control signal VC.

Charge pump circuit 7 comprises inverter 71, P channel transistor 72 and N channel transistor 73. Inverter 71 inverts phase error signal PCUP. The source of P channel transistor 72 is connected to a power supply, and the gate thereof receives the supply of the inverse signal of phase error signal PCUP from inverter 71. From the drain of P channel transistor 72, charge pump signal PVP is output. The source of N channel transistor 73 is connected to ground, and the gate thereof receives phase error signal PCDN. The drain of N channel transistor 73 is connected to that of P channel transistor 72.

Charge pump circuit 8 comprises inverter 81, P channel transistor 82 and N channel transistor 83. Inverter 81 inverts frequency error signal FCUP. The source of P channel transistor 82 is connected to a power supply, and the gate thereof receives the supply of the inverse signal of frequency error signal FCUP from inverter 81. From the drain of P channel transistor 82, charge pump signal FVP is output. The source of N channel transistor 83 is connected to ground, and the gate thereof receives frequency error signal FCDN. The drain of N channel transistor 83 is connected to that of P channel transistor 82.

An operation of the PLL circuit in this embodiment will be explained next referring to FIG. 2. Frequency comparator 2 is always active and carries out frequency comparison between inverse regenerated clock CKI and input data signal train ID as a reference. In this frequency comparison, it is detected whether a difference between a spectral component frequency that a repeat frequency of data signal train ID has (hereinafter called the frequency of data signal train ID) and a frequency of inverse regenerated clock signal CKI, that is, the frequency of regenerated clock CK, falls within a predetermined range, and frequency error signal FCUP or FCDN in response to this frequency difference is generated. In other words, when the frequency difference falls within the predetermined range, frequency lock signal FL at level "1" showing the establishment of the frequency locked state is generated and output. when the frequency difference is out of the predetermined range, frequency lock signal FL at "0" level is generated and output. When the frequency of regenerated clock CK is lower or higher than that of data signal train ID, frequency error signal FCUP or FCDN is output respectively.

Charge pump circuit 8 deposits a charge and raises direct current charge pump signal FVP when frequency error signal FCUP is at level "1", that is, when the inverse signal thereof is at level "0". When frequency error signal FCDN is at level "1", charge pump circuit 8 removes a charge and lowers direct current charge pump signal FVP to supply it to LPF 4.

LPF 4 smoothes charge pump signal FVP and outputs to adder 9 voltage control signal FVC corresponding to the voltage of charge pump signal FVP. LPF 4 comprises large capacity capacitor C41 on its input side and has a sufficiently large time constant when compared with that of LPF 3 which will be described later in a phase control system. In a frequency unlocked state, the phase system loop is not active as will be described later. Therefore, adder 9 supplies to VCO 5 control voltage FVC as it is as voltage control signal VC. In a frequency locked state, the voltage kept by capacitor C41 becomes voltage control signal FVC. Adder 9 adds control voltage PVC from the phase system to control voltage FVC to generate voltage control signal VC. In this manner, the phase system loop operates based on voltage control signal FVC as the center voltage.

As in the conventional PLL circuit, VCO 5 outputs oscillation signal OF at a frequency in proportion to voltage control signal VC. Divider circuit 6 divides oscillation signal OF by a predetermined divide ratio and outputs regenerated clock CK. Regenerated clock CK is supplied to both frequency comparator 2 through an inverter and phase comparator 1.

Phase comparator 1 operates when frequency lock signal FL is at level "1", that is, when the frequency is locked. As in the conventional PLL circuit, phase comparator 1 compares phases between input data signal train ID and regenerated clock signal CK. When the phase of regenerated clock signal CK is behind or ahead of that of input data stream signal ID, phase comparator 1 outputs phase error signal PCUP or PCDN at level "1" respectively. When frequency lock signal FL is at level "0", that is, when the frequency is unlocked, phase comparator suspends its operation and outputs both phase error signals PCUP and PCDN at level "0".

Charge pump circuit 7 deposits a charge when phase error signal PCUP is at level "1", that is, when the inverse signal thereof is at level "0" and raises direct current charge pump signal PVP via LPF 3. When phase error signal PCDN is at level "1", charge pump circuit 7 removes a charge, and lowers direct current charge pump signal PVP via LPF 3.

LPF 3 operates when frequency lock signal FL is at level "1", that is, when the frequency is locked. LPF 3 smoothes charge pump signal PVP and outputs to adder 9 voltage control signal PVC corresponding to the voltage of charge pump signal PVP. Adder 9 adds voltage control signal PVC to voltage control signal FVC from the frequency system and outputs voltage control signal VC. As has been described above, frequency comparator 2 is always active and carries out comparison with the frequency of inverse regenerated clock CKI. Therefore, in a frequency locked state, the phase system loop operates based on voltage control signal FVC having a large time constant as the center voltage.

The phase system loop does not operate when frequency lock signal FL is at level "0", that is, when the frequency is unlocked. Control voltage PVC is then fixed to a voltage corresponding to a center (center voltage) of the capture range of the phase system loop (phase capture range), and the frequency is pulled in at the center of the phase capture range. In this manner, in a frequency unlocked state, the phase system loop is shut off and the frequency is pulled in by the frequency system loop alone without disturbance by the phase system loop.

In other words, in the frequency unlocked state, only the frequency system loop carries out the frequency pull in operation, while in the frequency locked state both the frequency system loop and the phase system loop operate to maintain the phase locked state. As has been described above, frequency comparator 2 is operated at this stage by inverse regenerated clock CKI having the inverse phase of regenerated clock CK. Therefore, frequency comparator is always outputting either frequency error signal FCUP or FCDN. Charge pump signal FVP as the result of the frequency error signal is generated as voltage control signal FVC changing at a sufficiently long period due to LPF which has a large time constant. The phase system loop operates based on voltage control signal FVC as a center voltage signal. Therefore, the phase system loop can maintain the phase locked state by detecting a slight phase error centering around an optimal frequency detected by the frequency system.

As has been described above, LPF 4 in the frequency system has a sufficiently large time constant when compared with that of LPF 3 in the phase system. Therefore, when the frequency system operates during the operation of the phase system, the frequency system operates as an integral term while the phase system operates as a differential term, and a cooperation effect from the both can be expected for the whole PLL operation.

In this manner, when the frequency of the input data signal train changes widely after the establishment of the phase locked state, the frequency system loop detects this change and maintains an optimal frequency voltage control signal VC. Therefore, when a high accuracy phase system loop having narrow capture range and lock range is used, the entire PLL has extremely wide capture range and lock range, and can follow the change in the frequency of the input data signal train without having a phase unlocked state.

Figure 3:
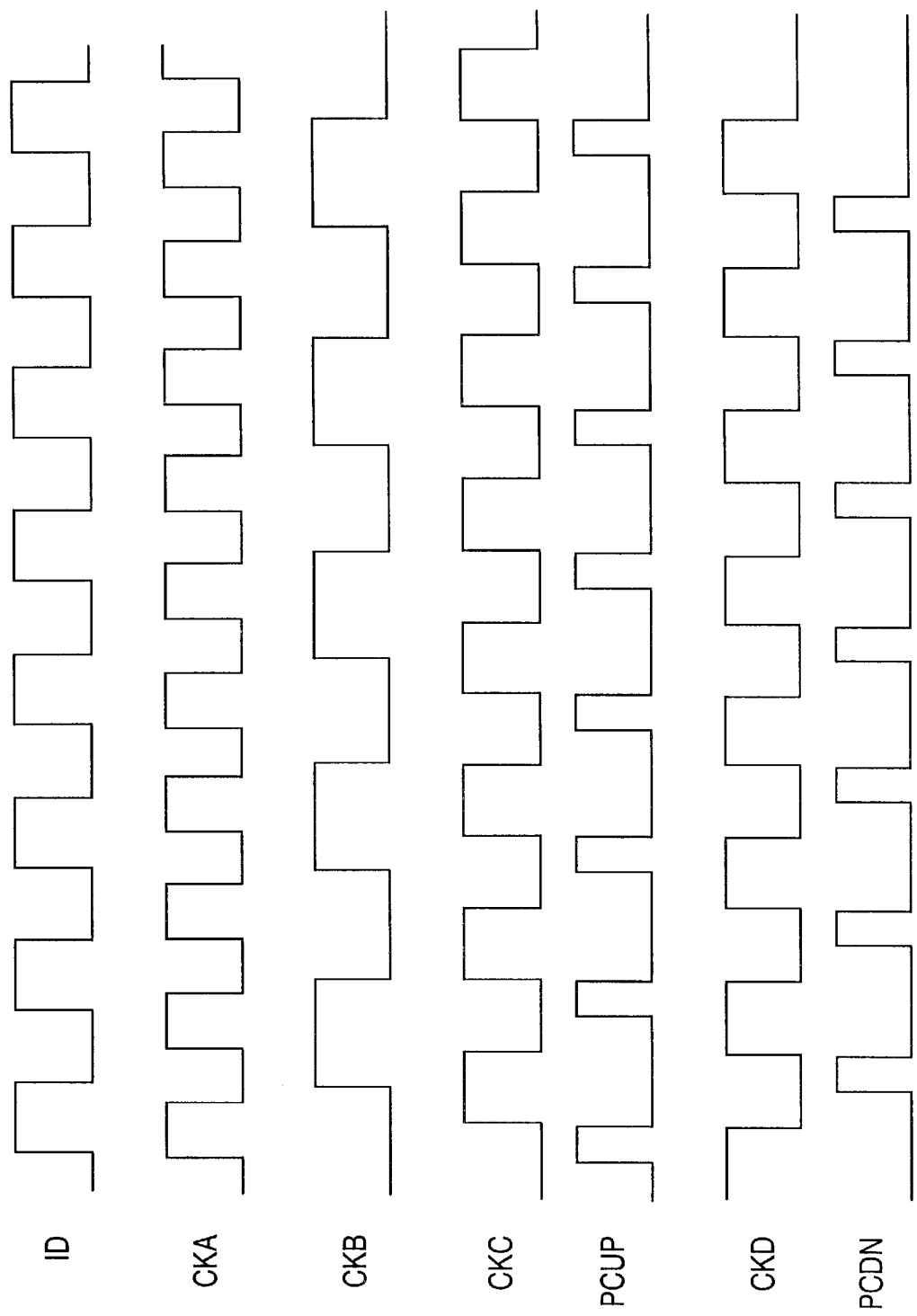
FIG. 3 is a timing chart showing relations between a data signal train, a regenerated clock, and a phase error signal of the PLL circuit in the first embodiment.

Details of the operation of the PLL circuit in this embodiment will be explained next referring to FIGS. 2 and 3. FIG. 3 shows a timing chart of data signal train ID, regenerated clock CK, and phase error signals PCUP and PCDN. When the frequency of data signal train ID is different from that of regenerated clock CK, frequency comparator 2 operates. Frequency comparator 2 outputs frequency error signal FCUP or FCDN at level "1" to try to make the frequencies of the both agree, and changes frequency lock signal FL to the "0" level (unlocked state).

Hereinafter, for the convenience of an explanation, data signal train ID is assumed to be in the same format as regenerated clock CK and to have the same period of its H and L level waveforms, that is, to have a duty ratio of 50%.

CKA to CKD shown in FIG. 3 are regenerated clocks. CKA shows the case where the frequency of the regenerated clock is higher than that of the data signal train, while CKB shows the case where it is low. CKC shows the case where the phase of the regenerated clock is behind that of the data signal train, while CKD shows the case where it is ahead of.

In the case of CKA, phase comparator 2 outputs frequency error signal FCDN at level "1" in a duty ratio proportional to a difference in periods of the both signal waveforms or frequencies (hereinafter called frequency difference) within a preset period. Examples of the duty ratio proportional to the frequency difference will be provided below. When the ratio of the frequency difference between data signal train ID and regenerated clock CK is 50%, that is, frequency of regenerated clock CK / frequency of data signal train ID=1.5, each period of level "1" and level "0" of the frequency error signal FCDN takes 50% in the waveform. When the ratio of the frequency difference is 10% (frequency of regenerated clock CK / frequency of data signal train ID=1.1), the frequency error signal FCDN at level "1" and "0" has 10% and 90% periods of waveforms respectively.

In charge pump circuit 8, N channel transistor 83 becomes ON and removes a charge from LPF 4 including capacitor C41. The amount of the removed charge is proportional to an ON period of N channel transistor 83, and controlled by frequency error signal FCDN in the end. Then the voltage of the corresponding charge pump signal FVP is lowered.

LPF 4 smoothes the voltage drop waveform of charge pump signal FVP due to the charge removal, and lowers the voltage of voltage control signal FVC to supply it to adder 9. Adder 9 adds voltage control signal FVC to voltage control signal PVC corresponding to the phase capture range center from LPF 3 in the phase system, and lowers voltage control signal VC to supply it to VCO 5.

By the drop of voltage control signal VC, VCO 5 lowers oscillation frequency and supplies oscillation signal OF at the lowered frequency to divider circuit 6. Divider circuit 6 lowers the frequency of regenerated clock CKA in response to the decrease in the frequency of oscillation signal OF.

In the case of clock CKB, frequency comparator 2 outputs frequency error signal FCUP at level "1" in a duty ratio proportional to the frequency difference.

In charge pump circuit 8, P channel transistor 82 becomes ON in response to the "1" level of frequency error signal FCUP and deposits a charge in LPF 4 including capacitor C41. The amount of the deposited charge is proportional to the ON period of P channel transistor 82, and is controlled by frequency error signal FCUP in the end. Charge pump circuit 8 raises the voltage of the corresponding charge pump signal FVP.

LPF 4 smoothes the voltage rise waveform of charge pump signal FVP due to the deposited charge, and raises the voltage of voltage control signal FVC to supply it to adder 9. Adder 9 adds voltage control signal FVC to control voltage PVC corresponding to the phase capture range center from LPF 3 in the phase system, and raises voltage control signal VC to supply it to VCO 5.

By the rise of voltage control signal VC, VCO 5 raises an oscillation frequency and supplies oscillation signal OF at the raised frequency to divider circuit 6. Divider circuit 6 raises the frequency of regenerated clock CKB in response to the increase in the frequency of oscillation signal OF.

As has been described above, when the frequency of data signal train ID is different from that of regenerated clock CK, the frequency difference will be canceled by the operation to reduce the frequency difference. When a state wherein the frequency difference does not exist continues for a certain period, frequency comparator 2 changes frequency lock signal FL to "1" and activates the phase system to add the phase pull in operation to the existing frequency pull in operation. In this manner, the frequency pull in operation and the phase pull in operation are carried out at the same time.

In this state, when the frequency difference continues to exist for a certain period, or when a frequency difference larger than a certain value occurs, frequency comparator 2 changes frequency lock signal FL to "0" and suspends the operation of the phase system to make the frequency system operate alone again.

In the case of clock CKC where the phase of regenerated clock CK is behind that of data stream signal ID, phase comparator 1 outputs phase error signal PCUP at the level "1" in a duty ratio proportional to the phase difference.

In charge pump circuit 7, P channel transistor 72 becomes ON in response to the "1" level of phase error signal PCUP and deposits a charge in LPF 3. The amount of the deposited charge is proportional to the ON period of P channel transistor 72, and is controlled by phase error signal PCUP. Charge pump circuit 7 raises the voltage of the corresponding charge pump signal PVP.

LPF 3 smoothes the voltage rise waveform of charge pump signal PVP due to the deposited charge, and raises the voltage control signal PVC to supply it to adder 9. Adder 9 adds voltage control signal PVC to voltage control signal FVC from LPF 4 in the frequency system, and raises voltage control signal VC to supply it to VCO 5.

By the rise of voltage control signal VC, VCO 5 raises an oscillation frequency and supplies oscillation signal OF at the raised frequency to divider circuit 6. Divider circuit 6 raises the frequency of regenerated clock CKC in response to the increase in the frequency of oscillation signal OF.

In the case of clock CKD where the phase of regenerated clock CK is ahead of that of data signal train ID, phase comparator 1 outputs phase error signal PCDN at the level "1" in a duty ratio proportional to the phase difference.

In charge pump circuit 7, N channel transistor 73 becomes ON in response to the "1" level of phase error signal PCDN and removes a charge from LPF 3. The amount of the removed charge is proportional to the ON period of N channel transistor 73, and is controlled by phase error signal PCDN. Charge pump circuit 7 lowers the voltage of the corresponding charge pump signal PVP.

LPF 3 smoothes the voltage drop waveform of charge pump signal PVP due to the charge removal, and lowers the voltage control signal PVC to supply it to adder 9. Adder 9 adds voltage control signal PVC to voltage control signal FVC from LPF 4 in the frequency system to lower voltage control signal VC, and supplies it to VCO 5.

By the drop of voltage control signal VC, VCO 5 lowers an oscillation frequency and supplies oscillation signal OF at the lowered frequency to divider circuit 6. Divider circuit 6 lowers the frequency of regenerated clock CK and delays the phase of regenerated clock CKD in response to the frequency decrease of oscillation signal OF.

A frequency difference between data signal train ID and regenerated clock CK exists at this stage. In other words, the cases wherein frequency is not locked are as follows:

1. When the PLL circuit starts its operation;
2. When the frequencies of the both are not judged to be the same for more than a certain period;
3. When the frequencies of the both are detected to be in disagreement for more than a certain period; and
4. When the frequency difference exceeding a certain degree occurs even once. Particularly, the case 2 is the condition under which frequency is regarded to be in a frequency locked state in an actual frequency unlocked state, while conditions 3 and 4 are the conditions under which frequency is regarded to be in a frequency unlocked state in an actual frequency locked state.

In this frequency unlock state, VCO 5 is controlled by voltage control signal VC which is a sum of voltage control signal FVC from the frequency system and a fixed voltage control signal PVC corresponding to the phase capture range center from the phase system. Therefore, the entire PLL circuit is controlled by the frequency system loop and a frequency pull in operation is carried out thereby. In the frequency locked state, VCO 5 is controlled by voltage control signal VC which is a sum of voltage control signal FVC from the frequency system and voltage control signal PVC from the phase system. Therefore, the entire PLL circuit is controlled by both the phase system loop and the frequency system loop, and both frequency pull in and phase pull in operations are carried out thereby.

If the period of comparison detection by frequency comparator 2 (hereinafter called the frequency comparison period) is longer enough than the period of comparison detection by the phase comparator 1 (hereinafter called phase comparison period), the time constant can become larger and accurate frequency detection can be carried out without disturbing the operation of the phase system.

It has been found experimentally that it is preferable for the frequency comparison period to be more than 100 times the phase comparison period. It is also preferable for the phase comparison period to include a rising/falling edge of the data signal train in order to ensure enough gain.

As has been described in the above, an instantaneous frequency fluctuation is detected by the phase system loop as the phase difference. By the operation of phase pull in, it acts as a differential term of the entire PLL system. Slow frequency swing in a long period is detected by the frequency system loop as the frequency difference. By the operation of frequency pull in, it acts as an integral term of the entire PLL system.

If the PLL circuit of this embodiment is used in an apparatus for reproducing signals recorded in a digital information recording medium such as an optical disc, a magnetic tape, and a magnetoptic card or the like, the frequency system loop follows and absorbs jitters due to the reproducing apparatus, or wow or flutter due to a fluctuation in a tape running speed, or an uneven rotation of an optical disc, since these are of low frequency fluctuations. On the other hand, the phase system loop follows and absorbs a frequency fluctuation due to mispositioning of patterns, cutting misalignment, a distortion of a record symbol, and the like upon recording found in recorded signals or reproduced signals, since these are of high frequency fluctuations.

Figure 4A:
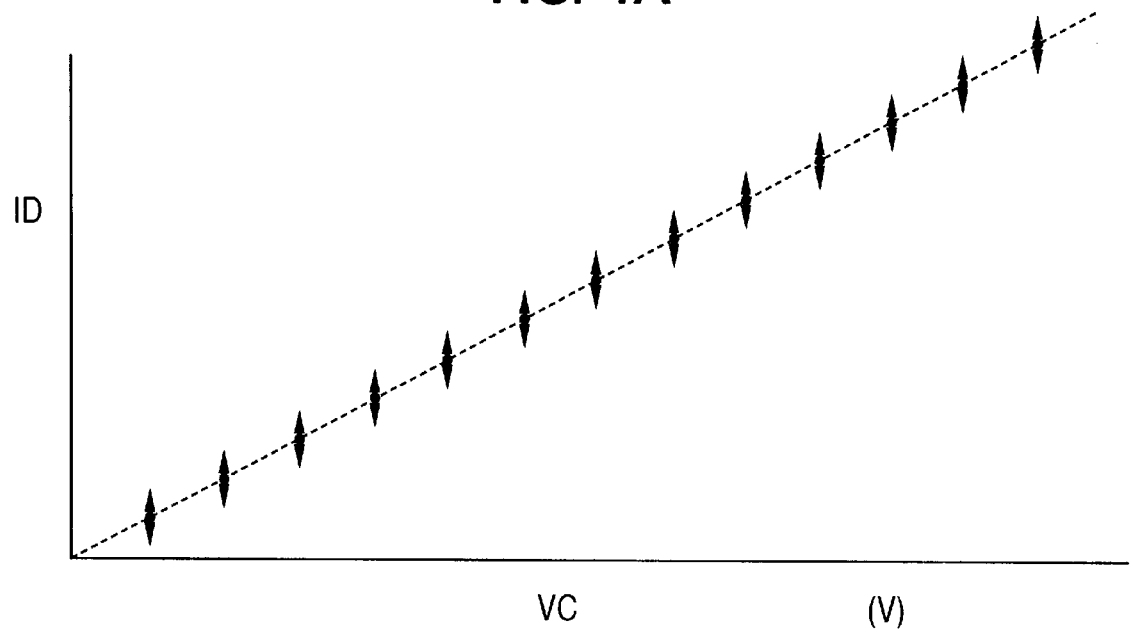
FIG. 4(A) is a diagram explaining a relation between the frequency of the data signal train ID and a voltage control signal VC of the PLL circuit of the first embodiment in the case where the frequency of the data signal train ID changes after phase locking has been established.
Figure 4B:
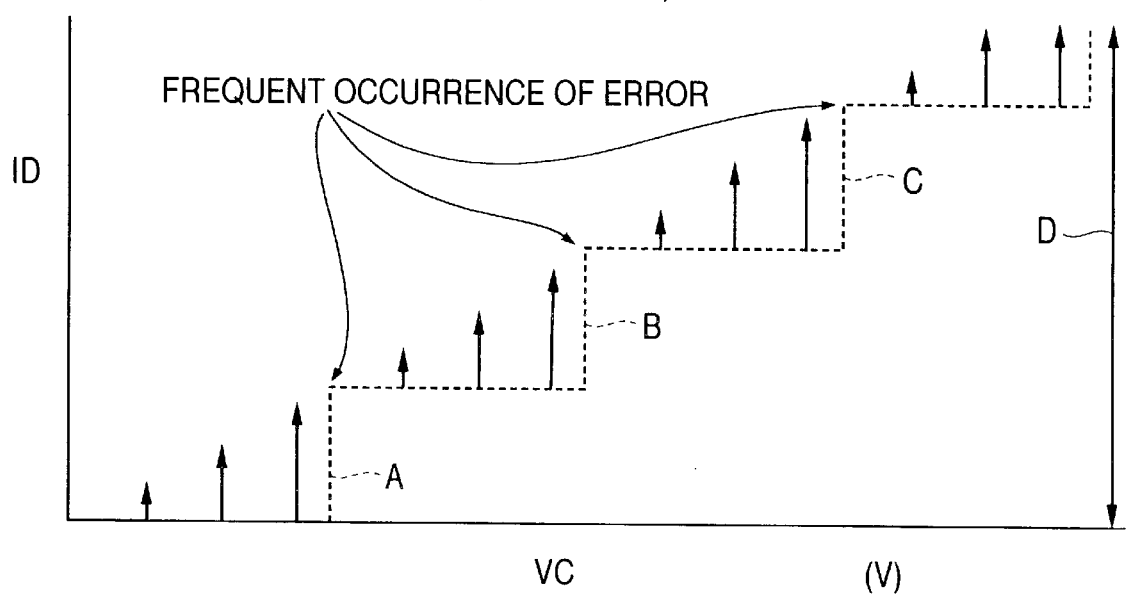
FIG. 4(B) is a diagram explaining a relation between the frequency of a data signal train ID and a voltage control signal VC of the conventional PLL circuit in the case where the frequency of the data signal train changes after phase locking has been established.

Advantageous results of the PLL circuit in this embodiment will be explained next referring to FIGS. 4(A) and 4(B). FIGS. 4(A) and 4(B) show relations between voltage control signal VC to VCO 5 and the frequency of data signal train ID in the PLL circuit in this embodiment and in the conventional PLL circuit, when the frequency of data signal train ID changes after phase locked state has been established.

The frequency change of data signal train ID after the phase lock establishment often occurs in CAV reproduction by a reproducing apparatus for a disc such as a compact disc. In the example of the conventional PLL circuit, as shown in FIG. 4(B), voltage control signal of the frequency system loop does not follow the change and only the phase system loop tries to maintain the locked state. Therefore, a wide capture range and a wide lock range are necessary for the phase system loop. When the frequency of data signal train changes exceeding the lock range of this phase system loop, a phase locked state cannot be maintained and the frequency loop control operates again at points A, B, and C shown in FIG. 4(B). As a result, data signal train reading becomes impossible and errors often occur. Furthermore, since locking occurs at a voltage control signal value outside the center of the lock range of the phase system, the lock range of the phase system is always vertically asymmetric. If the PLL circuit is not one which do not add the voltage control signal from the phase system to that from the frequency system, a very wide lock range of the phase system, as shown by D, would be necessary. This kind of PLL circuit is not practically feasible.

Since in the PLL circuit of this embodiment, as shown in FIG. 4(A), the frequency system is always following the frequency change of the data signal train and changes the voltage control signal output from the frequency system loop, the voltage control signal of the phase system loop only has to follow the voltage control signal of the frequency loop. Therefore, the capture range and the lock range of the phase system is always vertically symmetric around the center values thereof, and no wide capture range is necessary therefor.

Moreover, a wider lock range for the entire PLL can be obtained.

Figure 5:
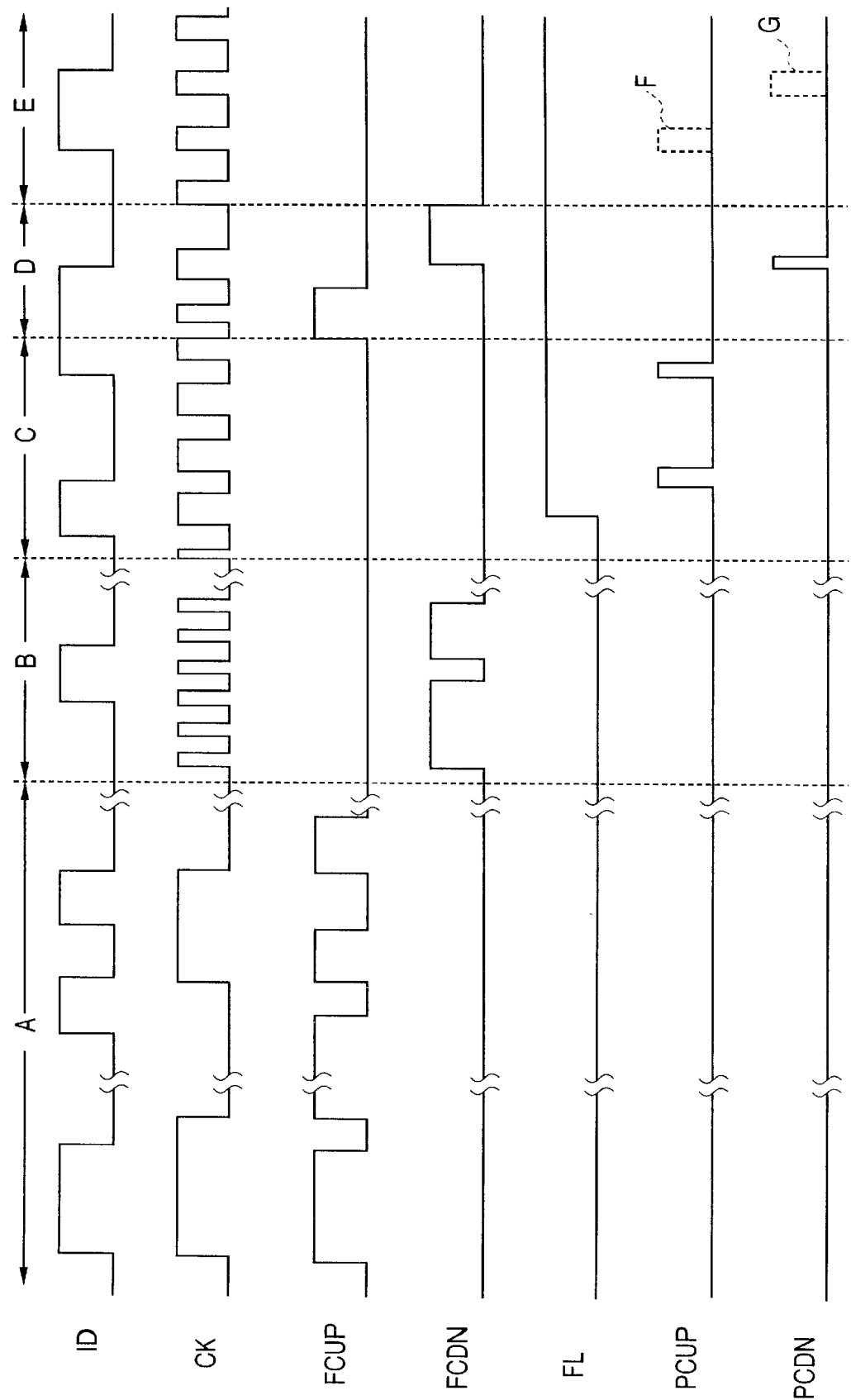
FIG. 5 is a timing chart showing an example of operation of the PLL circuit of the first embodiment.

An operation in the case where rising and falling edges of data signal train ID, that is, the change points thereof are not temporally constant will be explained next referring to the timing chart in FIG. 5 showing this case. Period A shows the case where the frequency of regenerated clock CK is lower than that of data signal train ID. As has been described in the above, frequency error signal FCUP is output in this case. The subsequent period B shows the case where the frequency of regenerated clock CK is higher than that of data signal train ID. Frequency error signal FCDN is output in this case.

These periods A and B are the periods of the frequency pull in process, and both frequencies are not in agreement. Frequency lock signal FL is thus at "0" level in these cases. Therefore, the phase system loop does not operate and phase error signals PCUP and PCDN are not output.

The process enters period C wherein frequency comparator 2 judges that both frequencies are in agreement. Frequency lock signal FL is changed to "1" level, and the phase system is activated in order to carry out the phase pull in operation as well as the frequency pull in operation.

Period C shows the case where the phase of regenerated clock CK is behind that of the data signal train ID. Phase comparator 1 outputs phase error signal PCUP at the timing of the change of data signal train ID.

The subsequent period D shows the case where the phase of regenerated clock CK is ahead of that of data signal train ID. Phase comparator 1 outputs phase error signal PCDN at the timing of the change of data signal train ID. If frequency comparator 2 judges that the frequency of regenerated clock CK is higher or lower than that of data signal train ID at this stage, frequency comparator 2 may output frequency error signal FCDN or FCUP respectively.

In period E, both the frequency and the phase between data signal train ID and regenerated clock CK are in agreement. Phase error signals PCUP and PCDN and frequency error signals FCUP and FCDN become "0" level and are not output.

In order to maintain control voltage VC of VCO 5, phase comparator 1 may output phase error signals PCUP and PCDN having the same pulse width.

An example will be explained next wherein the present invention is applied to a frequency comparator of a PLL circuit in a reproducing apparatus for a compact disc (CD) in which data signal train ID is modulated by an Eight to Fourteen Modulation (EFM) method which will be described later.

The EFM is a modulation wherein so-called self-clocking is available in which a clock is superposed on a data signal train, but in this method, rising and falling edges of a recorded signal of CD, for example, is temporally indefinite.

In the EFM method, 8-bit digital data called a record symbol are converted to a 14-channel bit pattern. Taking an easiness in bit frequency information extraction, high density recording, and a direct current component of a signal into consideration, a minimum inversion interval Tmin is stipulated to be 3T while a maximum inversion interval Tmax is 11T where T means a sampling interval. The inverse 1/T of the sampling interval T is the frequency of the regenerated clock. One frame is composed of 588 bits based on the above 14-channel bit and a 3-bit margin bit. At the head of the frame, a synchronization pattern (SYNC) exists. The SYNC pattern is defined to be 22T wherein the maximum inversion interval Tmax (11T) appears twice.

Figure 6:
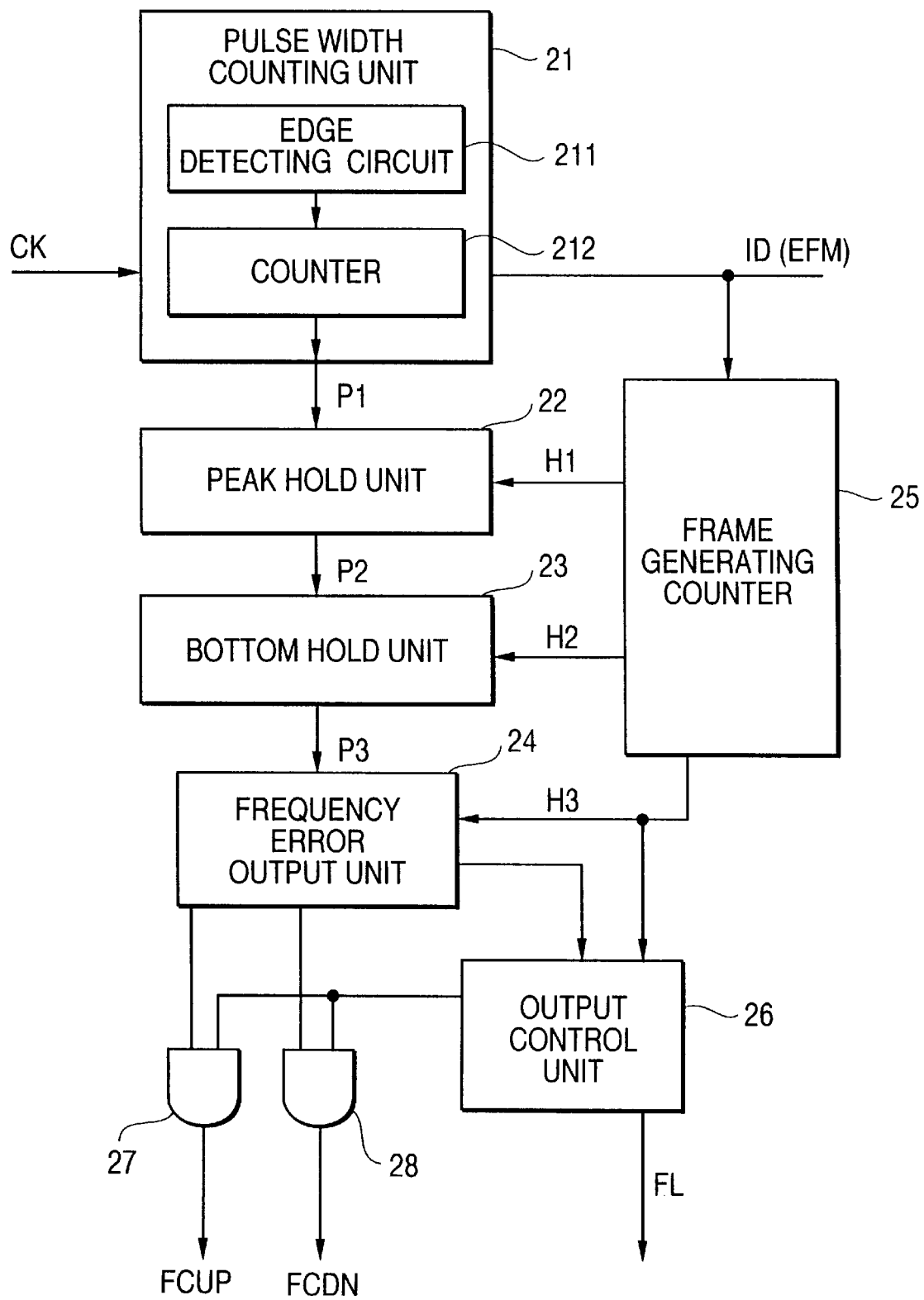
FIG. 6 is a block diagram showing a configuration of a frequency comparator circuit in the PLL circuit of the first embodiment.

FIG. 6 is a block diagram showing a configuration of frequency comparator 2 which features the embodiment of the present invention. Pulse width counting unit 21 measures a period between a rising edge of data signal train ID which is an EFM signal and a subsequent rising edge thereof by using inverse regenerated clock CKI which is an inverse of regenerated clock CK, and outputs pulse width data P1. Peak hold unit 22 detects peak value P2 which is a longest period of pulse width P1 within a preset hold period H1. Bottom hold unit 23 holds bottom value P3 which is a shortest peak value among peak values P2 within a preset hold period H2. Frequency error output unit 24 calculates the frequency difference between data signal train ID and inverse regenerated clock CKI based on the pulse width of bottom value P3 held within a preset hold period H3, and outputs either frequency error signal FCUP or FCDN via AND circuits 27 or 28 respectively. Frame generating counter 25 temporarily calculates one frame of the EFM signal based on data signal train ID, supplies hold period H3 to frequency error output unit 24, and supplies hold periods H1 and H2 to peak hold unit 22 and bottom hold unit 23 respectively. Output control unit 26 judges that frequencies of data signal train ID and regenerated clock CK are in agreement and outputs frequency lock signal FL, if either the frequency difference calculated by frequency error output unit 24 does not occur within preset hold period Hi or it is within a certain range. Output control unit 26 masks frequency error signals FCUP and FCDN upon necessity to make them to level "0".

Pulse width counting unit 21 comprises edge detecting circuit 211 and counter 212 which uses inverse regenerated clock CKI as a clock.

The operation of the present embodiment will be explained next referring to FIG. 6. The maximum inversion interval Tmax (11T) of the EFM signal for measuring the frequency of data signal train ID which is an EFM signal is measured first.

Pulse width counting unit 21 detects rising and falling edges of data signal train ID using edge detecting circuit 211, measures the period of the detected edges by counter 212 with reference to regenerated clock CKI, and outputs pulse width data P1.

If the period between the rising edges or between the falling edges is measured independently, the resolution becomes higher to $1/11=9\%$ (between rising and falling edges) or to $1/22\%$ (between either kind of edges) based on the interval between rising and falling edges or the maximum inversion interval Tmax=11T of the period between the both edges, since the maximum inversion interval of the EFM signal is 22T of the SYNC pattern SY.

The reason why the period of rising edges or falling edges is measured independently is that the SYNC pattern SY of the EFM signal has both the rising and falling edges.

The edge period thus measured, that is, pulse width data P1 are all supplied to peak hold unit 22.

Peak hold unit 22 detects and holds peak value P2 which is a maximum pulse width P1 within the hold period H1 having been preset by frame generating counter 25.

Hold period H1 is set by frame generating counter 25 in the following manner, by using the fact that an average inversion interval of an EFM signal is approximately 5T. The length of one frame is detected by directly counting input EFM signals and a temporary frame cycle signal is generated. In other words, since the average inversion interval of the EFM signal is 5T and 1 frame is 588T, the frame cycle signal becomes $588/5 \leqq 117$. That is, the length of 1 frame is equivalent to 117 times the average inversion interval of the EFM signal. Therefore, if hold period H1 is set to be longer than one frame by using the frame cycle signal, one frame has one SYNC pattern without fail, which guarantees that SYNC pattern can be detected.

When the EFM signal, that is, data signal train ID, has the same frequency as that of regenerated clock CK, the edge period, that is, pulse width P1 is 22T. When regenerated clock CK has higher frequency than the EF signal, 22T<pulse width P1. On the contrary, if regenerated clock CK has lower frequency than the EFM signal, 22T>pulse width P1. The frequency difference between the EFM signal and regenerated clock CK can be known quantitatively to be "22−n" if pulse width P1 is nT (n: natural number).

As has been described above, peak hold unit 22 detects and holds peak value P2 which is the maximum pulse width P1 within hold period H1 longer than one frame of EFM signal having been generated based on the frame cycle signal. Peak hold unit 22 then outputs peak value P2 to bottom hold unit 23. Therefore, the timing when peak value P2 is output is immediately before peak hold unit 22 is reset within hold period H1.

Bottom hold unit 23 detects and holds bottom value P3 which is a shortest peak value among peak values P2 supplied within hold period H2. Frame generating counter 25 sets hold period H2 to be longer than hold period H1 based on the frame cycle signal, as in the case of the setting of hold period H1.

As has been described above, peak value P2 corresponding to the maximum pulse width P1 among the measured pulse widths P1 is detected, and bottom value P3 corresponding to the shortest peak value is detected and processed. In this manner, a long pulse width caused by a scratch or the like of a CD is eliminated to prevent erroneous detection and a stable peak value can be obtained.

Bottom value P3 output from bottom hold unit 23 is a SYNC pattern SY of EFM signals. At the same time, the difference between bottom value P3 and pulse width 22T of the SYNC pattern SY in a normal operation shows the frequency difference between data signal train ID and regenerated clock CK. Therefore, frequency error output unit 24 changes the pulse width of frequency error signals FCUP and FCDN according to the frequency difference, and outputs the signals to charge pump circuit used in the later stage. In this manner, frequency pull in operation is carried out.

Frequency error output unit 24 also counts the number of frequency agreement occurrence which is the state wherein the pulse width of bottom value P3 is 22T and thus has no difference from the pulse width of SYNC pattern SY in a normal operation. When the frequency agreement continues to occur for a predetermined number of times, the frequencies of data signal train ID and regenerated clock CK are judged to be in agreement, and frequency lock signal FL is output.

Figure 7:
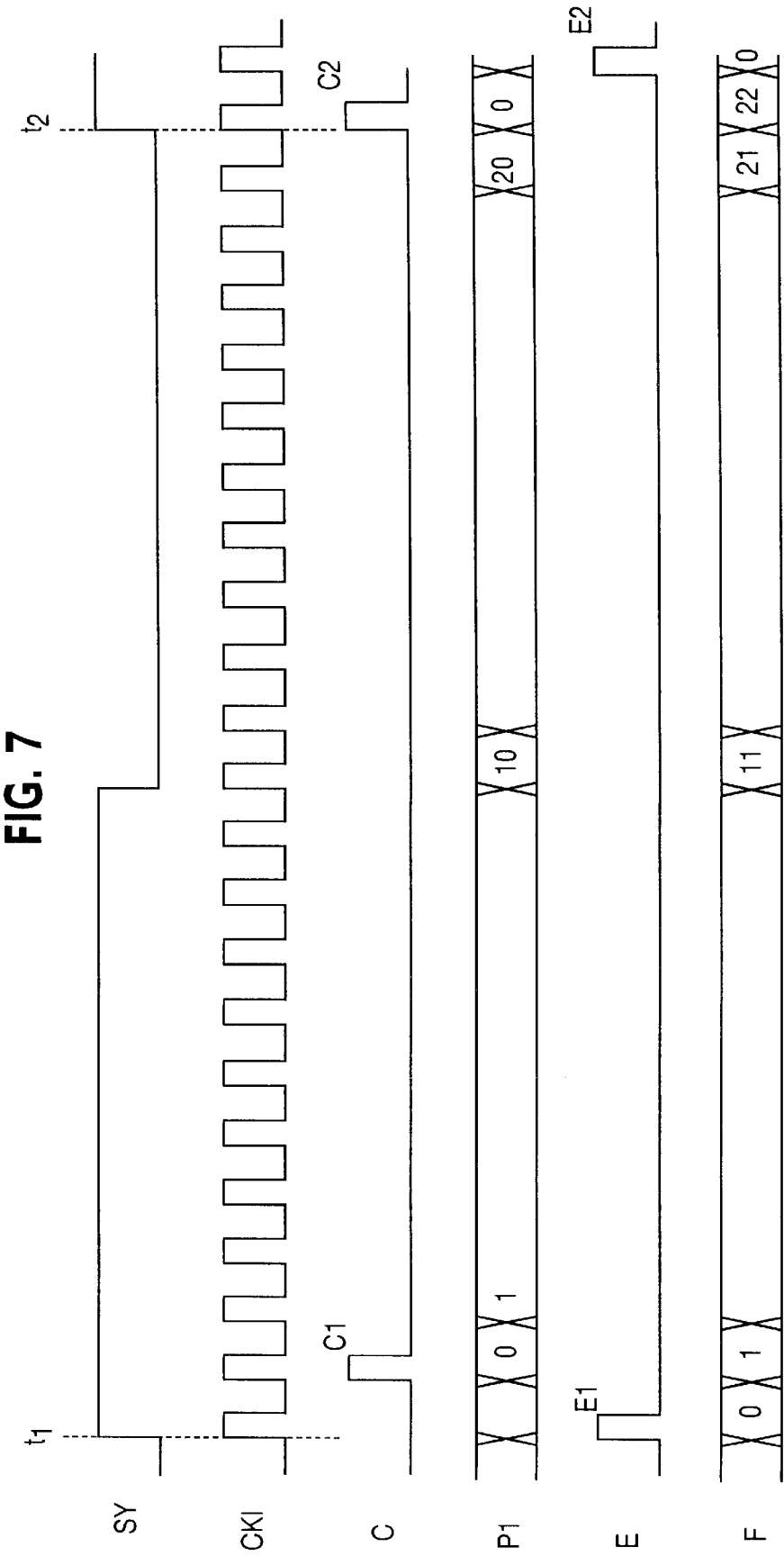
FIG. 7 is a timing chart showing an example of operation of the frequency comparator circuit shown in FIG. 6.

An operation of pulse width counting unit 21 will be explained next with reference to FIG. 7 which is a timing chart of each waveform. Edge detecting circuit 211 detects a rising edge of SYNC pattern SY by using inverse regenerated clock CKI which is the inverse of regenerated clock CK. At this time, when the phase is locked, the edge of inverse regenerated clock CKI rises at almost the same time as the rising/falling edge of SY of SYNC pattern because of the phase locked state.

When the rising edge of inverse regenerated clock CKI is slightly earlier than the rising edge of SYNC pattern SY at time $t_1$, edge detecting circuit 211 generates a corresponding edge detection signal C1.

Counter 212 uses edge detection signal C1 and inverse regenerated clock CKI as a reset pulse and a clock respectively, and counts up at every period (T) of inverse regenerated clock CKI.

When the rising edge of inverse regenerated clock CKI is slightly later than that of SYNC pattern SY at time $t_2$, edge detecting circuit 211 generates a corresponding rising edge detection signal C2. Counter 212 is reset by this edge detection signal C2 and the value of the counter, that is, the value of the count corresponding to pulse width P1 is 20.

Counter 212 has started counting from 0, and ended at 20. Therefore, pulse width P1 is 21T and shorter than 22T of a normal SYNC pattern by 1T. In other words, since the rising edge of inverse regenerated clock CKI is earlier than that of SYNC pattern SY at time $t_1$ while it is later at time $t_2$, frequency of inverse regenerated clock CKI is lower than that of SYNC pattern SY. Therefore, when pulse width P1 is 21T, frequency comparator 2 outputs frequency error signal FCUP.

On the contrary, when the rising edge of inverse regenerated clock CKI is slightly later than that of SYNC pattern SY at time $t_1$, edge detecting circuit 211 outputs rising edge detection signal E1 and counter 212 starts counting. When the rising edge of inverse regenerated clock CKI is slightly earlier than that of SYNC pattern SY at time $t_2$, edge detecting circuit 211 outputs rising edge detection signal E2 and counter 212 stops counting. The value F of the count is 22 in this case. In other words, pulse width P1 is 23T which is longer than the normal SYNC pattern 22T by 1T. Therefore, the frequency of inverse regenerated clock CKI is higher than that of SYNC pattern SY. As a result, frequency comparator 2 outputs frequency error signal FCDN.

Figure 8:
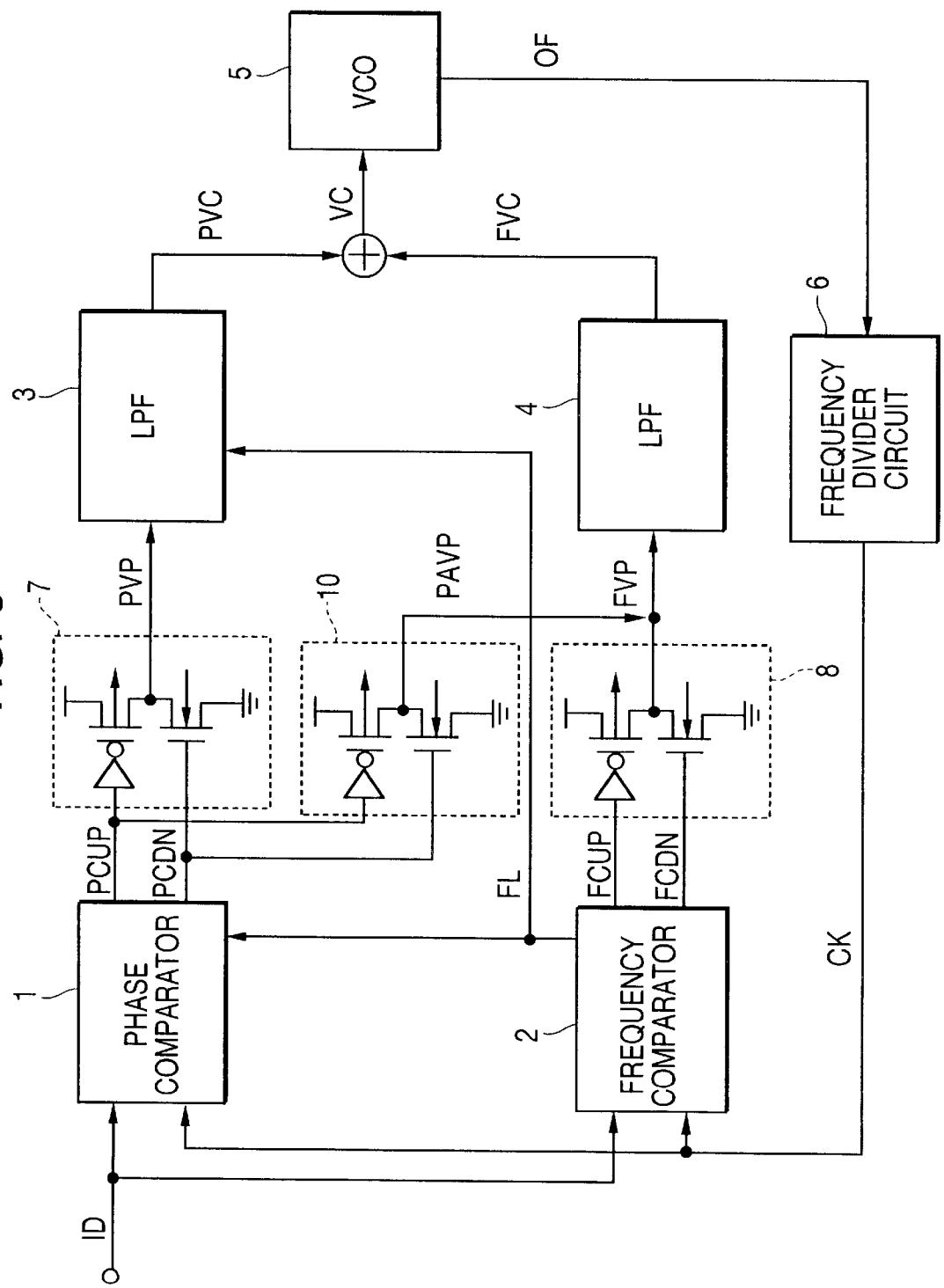
FIG. 8 is a block diagram showing a second embodiment of the PLL circuit of the present invention.

FIG. 8 is a block diagram showing a second embodiment of the present invention. In FIG. 8, components common to FIG. 1 have the same reference characters/numbers. The embodiment shown in FIG. 8 is different from the first embodiment in the following point. In FIG. 8, the second embodiment comprises charge pump circuit 10 which is connected to charge pump circuit 7 in parallel and generates direct current charge pump signal PAVP for depositing or removing a charge in response to the supply of phase error signal PCUP or PCDN output from phase comparator 1. Charge pump circuit 10 outputs direct current charge pump signal PAVP to LPF 4.

In this manner, a drift of the loop due to a slight dead band of frequency detection which may exist in the first embodiment and will be explained later is eliminated. Therefore, frequency change can be followed after the phase locked state has been established.

As has been described in the above, frequency comparator 2 judges that the frequency has been locked when pulse width P1 detected by pulse width counting unit 21 is 22T which is the same as a normal SYNC pattern. Therefore, no frequency error signal FCUP or FCDN is output. In other words, this pulse width 22T is the dead band at which frequency comparator 2 does not judge a frequency difference.

When a state of 22T pulse width continues for a long time, no more charge is deposited in LPF 4 in the frequency system and the charge is removed gradually by a leak current of the circuit. As a result, the voltage control signal FVP is reduced. Furthermore, when the decrease in the voltage control signal FVP is compensated by the phase system, the insensitive state continues.

In this embodiment, charge pump circuit 10 is added to the phase system and charge pump signal PAVP corresponding to phase error signal PCUP or PCDN is supplied to the input of LPF 4 as an error signal of the frequency system. In this manner, even when frequency comparator 2 is not sensitive, voltage drop in control signal FVP is prevented.

Figure 9:
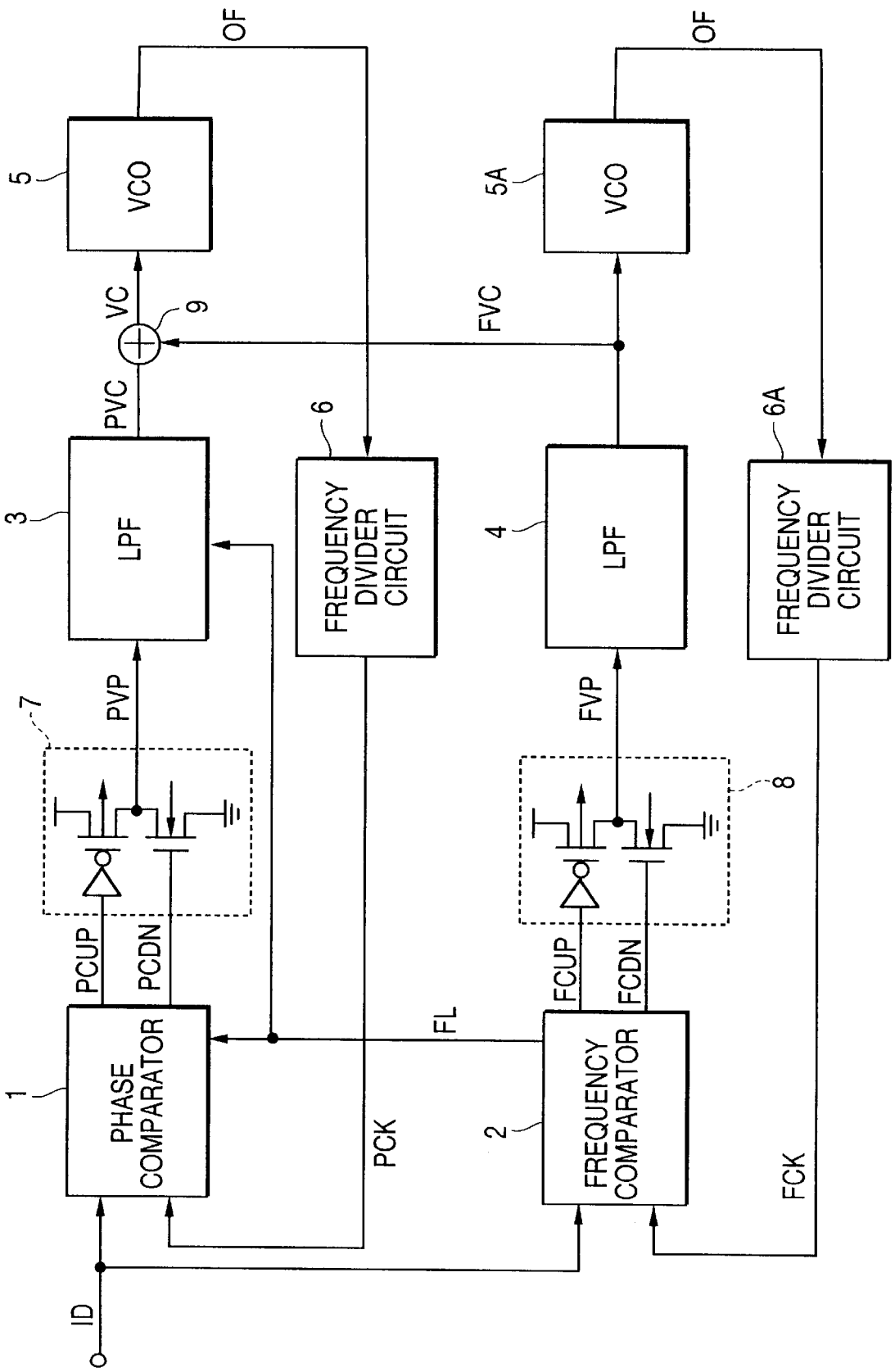
FIG. 9 is a block diagram showing a third embodiment of the PLL circuit of the present invention.

FIG. 9 is a block diagram showing a third embodiment of the present invention. Components common to FIG. 1 have the same reference characters/numbers. The embodiment shown in FIG. 9 is different from the first embodiment in the following points. This embodiment comprises VCO 5A and divider circuit 6A dedicated to the frequency system loop in addition to VCO 5 and divider circuit 6. In this manner, an independent loop is formed and voltage control signal FVC output from LPF 4 in the frequency system is added to control signal PVC from the phase system, as in the first embodiment.

By separating the frequency system loop, frequency pull in operation can be carried out without being affected by the phase system loop. Therefore, the dead band itself can be removed.

In other words, irrelevant to voltage control signal PVC in the phase system in the phase locked state, if the voltage control signal FVC of LPF 4 in the frequency system is lowered due to a leak current or the like, the frequency of clock FCK in the frequency system is lowered and frequency comparator 2 can detect it.

The embodiments of the present invention have been described above. However, the present invention is not limited to the above embodiments and various modifications can be made thereto. For example, it is needless to say that instead of VCO, a current controlled oscillator (ICO) may be used without deviating from the spirit of the present invention.

As has been described above, the PLL circuit of the present invention suspends the operation of the phase comparator when the frequency is not locked. When the frequency is locked, the phase comparator is activated to cooperate with the frequency comparator and the loop is controlled by the sum of the phase voltage control signal and the frequency voltage control signal. As a result, the frequency change of the input data signal train can be followed after the phase locked state has been established and a wide capture range can be obtained.

Furthermore, since the frequency system loop does not become insensitive after the establishment of the phase locked state and follows the frequency change of the input data signal train, frequency center values of the capture range/lock range can always be insured without fail. Therefore, even when the capture range/lock range of the phase system loop is narrow, the capture range/lock range of the entire PLL circuit is wide.

Moreover, when the frequency is not locked, by making the operation of the phase system loop suspended and changing the oscillation voltage control signal of the phase system loop to a median voltage value through centering thereof, frequency pull in operation can be carried out smoothly without disturbance from the phase system loop.

What is claimed is:
1. A PLL circuit comprising:
   a phase comparator which detects a phase difference between a synchronized data signal and a regenerated clock signal, and operates to output a phase error signal corresponding to the phase difference;
   a frequency comparator which detects a frequency difference between the synchronized data signal and the regenerated clock signal, and operates to output a frequency error signal corresponding to the frequency difference, and the operation of the phase comparator is suspended when the frequency difference exceeds a predetermined value; and
   a variable frequency signal generating device that generates and outputs the regenerated clock signal based on the phase error signal and the frequency error signal; wherein a frequency pull-in operation is carried out so that the frequency difference is canceled by a loop control using a frequency voltage control signal corresponding to the frequency difference, and in a frequency locked state, wherein the frequency difference is below the predetermined value, the phase comparator cooperates with the frequency comparators and a phase pull-in operation to cancel the phase differences and a phase locking operation at a value below a predetermined value of the phase differences are carried out by a loop control using a sum of a phase voltage control signal corresponding to the phase error signals and the frequency voltage control signal, and wherein the frequency comparator outputs a frequency lock signal showing that the frequency locked state has been established, and the phase comparator detects the phase difference in response to the supply of the frequency lock signal thereto, wherein in the case that the frequency is not locked, the phase voltage control signal is set to a value corresponding to a center voltage of one of either a phase lock range in the phase locking operation, and a phase capture range which is a range of the phase pull-in operation.

2. A PLL circuit as claimed in claim 1, wherein the variable frequency signal generating device comprises:

a first charge pump circuit which deposits or removes a charge in response to the supply of the frequency error signal thereto and generates a corresponding frequency charge pump signal which is a direct current voltage;

a frequency low pass filter which smoothes the frequency charge pump signal and generates the frequency voltage control signal;

a second charge pump circuit which deposits or removes a charge in response to the supply of the phase error signal thereto and generates a corresponding phase charge pump signal which is a direct current voltage;

a phase low pass filter which smoothes the phase charge pump signal and outputs the phase voltage control signal;

an adder which adds the frequency voltage control signal to the phase voltage control signal and generates a voltage control signal;

a voltage controlled oscillator which oscillates at a frequency corresponding to the voltage control signal and outputs an oscillation signal; and a divider circuit which divides the oscillation signal by a predetermined divide ratio and outputs the regenerated clock.

3. A PLL circuit as claimed in claim 2, wherein the PLL circuit further comprises:

a third charge pump circuit which deposits or removes a charge in response to the value of the phase error signal, generates a corresponding auxiliary phase charge pump signal which is a direct current voltage, and supplies the auxiliary phase charge pump signal to the frequency low pass filter, and the frequency low pass filter generates the frequency voltage control signal by smoothing a signal which is a sum of the auxiliary phase charge pump signal and the frequency charge pump signal.

4. A PLL circuit comprising:

a phase comparator which detects a phase difference between a data signal and a phase clock, and outputs a phase error signal corresponding to the phase difference;

a frequency comparator which detects a frequency difference between the data signal and a frequency clock, outputs a frequency error signal corresponding to the frequency difference,; and a variable frequency signal generating device which generates the phase clock and the frequency clock based on the phase error signal and the frequency error signal respectively; wherein and wherein a frequency pull-in operation is carried out so that the frequency difference is canceled by a loop control using a frequency voltage control signal corresponding to the frequency difference, and in a frequency locked state, wherein the frequency difference is below a predetermined value, the phase comparator cooperates with the frequency comparators and a phase pull-in operation to cancel the phase difference, and a phase locking operation at a value below a predetermined value of the phase difference are carried out by controlling a loop using a sum of a phase voltage control signal corresponding to the phase error signal and the frequency voltage control signal, and wherein the variable frequency signal generating device comprises:

a first charge pump circuit which deposits or removes a charge in response to the supply of the frequency error signal thereto and generates a corresponding frequency charge pump signal which is a direct current voltage;

a frequency low pass filter which smoothes the frequency charge pump signal and generates the frequency voltage control signal;

a second charge pump circuit which deposits or removes a charge in response to the supply of the phase error signal thereto and generates a corresponding phase charge pump signal which is a direct current voltage;

a phase low pass filter which smoothes the phase charge pump signal and outputs the phase voltage control signal;

an adder which adds the frequency voltage control signal to the phase voltage control signal and outputs a sum of both signals;

a first voltage controlled oscillator which oscillates at a frequency corresponding to the frequency voltage control signal and outputs a first oscillation signal;

a divider circuit which divides the first oscillation signal by a predetermined divide ratio and outputs a frequency regenerated clock;

a second voltage controlled oscillator which oscillates at a frequency corresponding to the sum of the phase voltage control signal and the frequency voltage control signal and outputs a second oscillation signal; and a divider circuit which divides the second oscillation signal by a predetermined divide ratio and outputs the phase regenerated clock.

5. A PLL circuit as claimed in claim 1, wherein the data signal comprises an EFM signal that further comprises a 14-channel bit pattern converted from an 8-bit record symbol of a compact disc, and in which a frame is composed of a predetermined number of regenerated clock signal periods, and wherein the PLL circuit further comprises:

a pulse width counting unit which measures one of
a period between a rising edge of the data signal and a subsequent rising edge thereof, and a period between a falling edge of the data signal and a subsequent falling edge thereof by using the regenerated clock signal, so as to output a pulse width data; p1 a peak hold unit which detects a peak value which is a longest period of the pulse width data within a first preset hold period;

a bottom hold unit which holds a bottom value which is a shortest peak value among the peak values within a second preset hold period;

a frequency error output unit which calculates the frequency difference based on the pulse width of the bottom value held within a third preset hold period and outputs the frequency error signal corresponding to the frequency difference;

a frame generating counter which temporarily calculates the frame and supplies the first, second, and third hold periods to the peak hold unit, the bottom hold unit, and the frequency error output unit respectively; and an output control unit, wherein
the output control unit judges that the frequencies of the data signal and the regenerated clock signal are in agreement when either the frequency difference calculated by the frequency error output unit does not occur within the first preset hold period, and the frequency difference is within a certain range, and wherein the output control unit outputs a frequency lock signal.

6. A PLL circuit as claimed in claim 5, wherein the pulse width counting unit comprises:

an edge detecting circuit which detects the rising and falling edges and outputs an edge detection pulse; and a counter which counts a period between two subsequent edge detection pulses by using the regenerated clock as a clock and generates the pulse width data.

7. A PLL circuit as claimed in claim 4, wherein the data signal comprises an EFM signal that further comprises a 14-channel bit pattern converted from an 8-bit record symbol of a compact disc, and in which a specific frame is composed of a predetermined number of clock periods; and wherein the PLL circuit further comprises:
a pulse width counting unit which measures one of
a period between a rising edge of the data signal and a subsequent rising edge thereof, and
a period between a falling edge of the data signal and a subsequent falling edge thereof by using the clock, in order to output a pulse width data;

a peak hold unit which detects a peak value which is a longest period of the pulse width data within a first preset hold period;

a bottom hold unit which holds a bottom value which is a shortest peak value among the peak values within a second preset hold period;

a frequency error output unit which calculates the frequency difference based on the pulse width of the bottom value held within a third preset hold period and outputs the frequency error signal corresponding to the frequency difference;

a frame generating counter which temporarily calculates the specific frame and supplies the first, second, and third hold periods to the peak hold unit, the bottom hold unit and the frequency error output unit, respectively; and an output control unit wherein
the output control unit judges that the frequencies of the data signal and the regenerated clock signal are in agreement when either
the frequency difference calculated by the frequency error output unit does not occur within the first preset hold period, and
the frequency difference is within a certain range, and wherein the output control unit outputs a frequency lock signal.

8. A PLL circuit as claimed in claim 7, wherein the pulse width counting unit comprises:

an edge detecting circuit which detects the rising and falling edges and outputs an edge detection pulse; and a counter which counts a period between two subsequent edge detection pulses by using the clock and generates the pulse width data.

9. A PLL circuit comprising:

a phase comparator
for detecting a phase difference between a synchronized data signal and a clock signal, and for operating to output a phase error signal corresponding to the phase difference;

a frequency comparator
for detecting a frequency difference between the synchronized data signal and the clock signal, and for operating to output a frequency error signal corresponding to the frequency difference, and wherein the operation of the phase comparator is suspended when the frequency difference exceeds a predetermined value; and a variable frequency signal generating unit
for generating the clock signal based on the phase error signal and the frequency error signal; wherein
the frequency comparator outputs a frequency lock signal for
indicating that a frequency locked state has been established, and wherein the frequency locked state comprises a state wherein the frequency difference is below the predetermined value,
wherein in the case that the frequency is not locked, the phase voltage control signal is set to a value corresponding to a center voltage of one of either a phase lock range in the phase locking operation, and a phase capture range which is a range of the phase pull-in operation.

10. A PLL circuit comprising:

a phase comparator
for detecting a phase difference between a data signal and a phase clock, and for outputting a phase error signal corresponding to the phase difference;

a frequency comparator
for detecting a frequency difference between the data signal and a frequency clock, outputs a frequency error signal corresponding to the frequency difference, and wherein
the operation of the phase comparator is suspended when the frequency difference exceeds a predetermined value; and a variable frequency signal generating unit
for generating the phase clock and the frequency clock based on the phase error signal and the frequency error signal, respectively; wherein
the variable frequency signal generating unit further comprises:
a first charge pump circuit for depositing and removing a charge in response to the supply of the frequency error signal thereto, and for generating a corresponding frequency charge pump signal for generating a frequency voltage control signal; and a second charge pump circuit
for depositing and removing a charge in response to the supply of the phase error signal thereto, and for generating a corresponding phase charge pump signal for generating a phase voltage control signal.

11. A PLL circuit as recited in claim 10, wherein
a frequency pull-in operation is carried out so that the frequency difference is canceled by a loop control of the frequency voltage control signal corresponding to the frequency difference, and wherein
in a frequency locked state, wherein the frequency difference is below a predetermined value,
the phase comparator cooperates with the frequency comparator, and
a phase pull-in operation to cancel the phase difference, and a phase locking operation at a value below a predetermined value of the phase difference, are carried out by controlling a loop using a sum of
the phase voltage control signal corresponding to the phase error signal, and
the frequency voltage control signal.

12. A method for performing a PLL, comprising the steps of:
detecting a phase difference between a synchronized data signal and a clock signal, and outputting a phase error signal corresponding to the phase difference;
detecting a frequency difference between the synchronized data signal and the clock signal, and outputting a frequency error signal corresponding to the frequency difference,
suspending the operation of the phase comparator when the frequency difference exceeds a predetermined value;
generating the clock signal based on the phase error signal and the frequency error signal;
outputting a frequency lock signal for indicating that a frequency locked state has been established, and
initiating the frequency locked state when the frequency difference is below the predetermined value,
wherein in the case that the frequency is not locked, the phase voltage control signal is set to a value corresponding to a center voltage of one of either a phase lock range in the phase locking operation, and a phase capture range which is a range of the phase pull-in operation.

13. A method for performing a PLL, comprising the steps of:
detecting a phase difference between a data signal and a phase clock, and outputting a phase error signal corresponding to the phase difference;
detecting a frequency difference between the data signal and a frequency clock, and outputting a frequency error signal corresponding to the frequency difference;
suspending the operation of the phase comparator when the frequency difference exceeds a predetermined value;
generating the phase clock and the frequency clock based on the phase error signal and the frequency error signal, respectively;
depositing and removing a charge in response to the supply of the frequency error signal thereto, and generating a corresponding frequency charge pump signal that is for generating a frequency voltage control signal; and
depositing and removing a charge in response to the supply of the phase error signal thereto, and generating a corresponding phase charge pump signal that is for generating a phase voltage control signal.

14. A method as recited in claim 13, further comprising the steps of:
performing a frequency pull-in operation so that the frequency difference is canceled by a loop control of the frequency voltage control signal corresponding to the frequency difference,
initiating a frequency locked state if the frequency difference is below a predetermined value, wherein the phase comparator cooperates with the frequency comparator, and then
performing a phase pull-in operation to cancel the phase difference, and a phase locking operation at a value below a predetermined value of the phase difference, by controlling a loop using a sum of
the phase voltage control signal corresponding to the phase error signal, and
the frequency voltage control signal.

* * * * *